(12) United States Patent
Seo (10) Patent No.: US 12,474,646 B2
(45) Date of Patent: Nov. 18, 2025

(54) HEATING UNIT, APPARATUS AND FACILITY FOR PROCESSING SUBSTRATES WITH SAME

(71) Applicant: SEMES CO., LTD., Cheonan-si (KR)

(72) Inventor: Jong Seok Seo, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 170 days.

(21) Appl. No.: 18/236,909

(22) Filed: Aug. 22, 2023

(65) Prior Publication Data
US 2024/0103388 A1 Mar. 28, 2024

(30) Foreign Application Priority Data
Sep. 22, 2022 (KR) .................. 10-2022-0120126

(51) Int. Cl.
*G03F 7/00* (2006.01)
*G03F 7/40* (2006.01)

(52) U.S. Cl.
CPC ............ *G03F 7/70875* (2013.01); *G03F 7/40* (2013.01); *G03F 7/70691* (2013.01)

(58) Field of Classification Search
CPC .... G03F 7/40; G03F 7/70691; G03F 7/70875; H01L 21/67; H01L 21/67103; H01L 21/67109; H01L 21/6715; H01L 21/677; H01L 21/683; H01L 21/67225; H01L 21/68707; H01L 21/68785
See application file for complete search history.

(56) References Cited

U.S. PATENT DOCUMENTS

| 2015/0243542 A1* | 8/2015 | Yoshihara | H01L 21/68728 156/345.23 |
| 2022/0208569 A1* | 6/2022 | Kim | H01L 21/67178 |
| 2023/0268174 A1* | 8/2023 | Nishiyama | B08B 7/04 134/6 |

FOREIGN PATENT DOCUMENTS

| CN | 107017180 A | * 8/2017 | ............. B08B 11/02 |
| JP | 2000-260677 | 9/2000 | |
| JP | 2001-297974 | 10/2001 | |
| KR | 10-2019-0053340 | 5/2019 | |

OTHER PUBLICATIONS

Office Action from the Korean Intellectual Property Office dated Jun. 24, 2024.

* cited by examiner

*Primary Examiner* — Peter B Kim (57) ABSTRACT

Proposed is an apparatus for processing substrates and a facility for processing substrates including a heating unit. The heating unit includes a heating plate provided in a heating space to heat a substrate while supporting the substrate; and a fixing portion configured to fix a position of the heating plate, wherein the fixing portion includes a plurality of fixing members spaced at regular intervals along a circumference of the heating plate, and the position of the heating plate may be fixed using a magnetic attraction of a magnetic member. At this time, the center position of the heating plate is fixed by the fixing members using the attraction of the magnetic member and at the same time, even if the heating plate is thermally expanded, the heating plate may remain level.

14 Claims, 5 Drawing Sheets

HEATING UNIT, APPARATUS AND FACILITY FOR PROCESSING SUBSTRATES WITH SAME

CROSS REFERENCE TO RELATED APPLICATION

The present application claims priority to Korean Patent Application No. 10-2022-0120126, filed Sep. 22, 2022, the entire contents of which is incorporated by reference herein for all purposes.

BACKGROUND OF THE INVENTION

1. Field of the Invention

The present disclosure relates to a heating unit for heating a substrate, an apparatus and a facility for processing substrates with the same.

2. Description of the Related Art

A semiconductor manufacturing process includes multiple thermal processes. A bake process, in which photoresist is applied to a substrate in a photo facility to form a resist film and then the substrate is heat-treated at a predetermined temperature to stabilize the resist film, is one example of the thermal processes.

A thermal process is carried out in a thermal chamber. The thermal chamber includes a heating unit and a cooling unit, and the heating unit may include a hot plate. A heating process by using the heating unit may be performed by placing a substrate on a hot plate maintained at a high temperature and maintaining the state for a predetermined time. After the heating process is completed, a transport robot takes the substrate out of the heating unit, and then a cooling process may be performed by placing the substrate on a cooling plate provided as a cooling member in a cooling unit.

Generally, the position of a heating plate (hot plate) on which a substrate is placed for a heating process is completely fixed by a fixing member such as a fixing bolt. Yet, in the case of internal structures of the heating unit including the heating plate, thermal deformation such as thermal expansion may be accompanied due to a temperature increase for the heating process.

In fact, when thermal deformation occurs in the structures, such as heating plates, whose positions are completely fixed by fixing members, a process of compensation for thermal deformation of a structure cannot be performed because of a fixing member that completely fixes the position of the structure. For example, as the temperature rises, a heating plate thermally expands but when it can no longer expand in the horizontal direction due to the fixing member, deformation such as bending occurs in the heating plate. As a result, the flatness of the heating plate is not maintained constantly. This may cause sealing failure of the heating plate.

The sealing failure of the heating plate leads to contamination of a substrate and internal structures of a heating unit, and may act as a cause of particle sources and device failure. Therefore, a solution to these problems is needed.

SUMMARY OF THE INVENTION

Accordingly, the present disclosure has been made keeping in mind the above problems occurring in the related art, and the present disclosure is intended to provide a heating unit, an apparatus and a facility for processing substrates with the same, capable of keeping a heating plate flat by performing compensation for thermal defamation without changing the position of the heating plate when the thermal deformation occurs in the heating plate.

Objectives of the present disclosure are not limited thereto, and other objectives not mentioned will be clearly understood by those skilled in the art from the following description.

In order to achieve the above objective, according to an embodiment of the present disclosure, there is provided a heating unit including: a heating plate provided in a heating space to heat a substrate while supporting the substrate; and a fixing portion configured to fix a position of the heating plate, wherein the fixing portion may include a plurality of fixing members spaced at regular intervals along a circumference of the heating plate, and the position of the heating plate may be fixed using a magnetic attraction of a magnetic member.

According to an embodiment of the present disclosure, there may be provided an apparatus for processing substrates including: a housing configured to provide an internal space; a heating plate provided in the internal space and configured to heat a substrate; a cooling unit provided on a side of the heating unit and configured to cool the substrate; and a transport plate configured to transport the substrate between the heating unit and the cooling unit. The heating unit may include: a heating plate provided in a heating space to heat a substrate while supporting the substrate; and a fixing portion configured to fix a position of the heating plate, wherein the fixing portion may include a plurality of fixing members spaced at regular intervals along a circumference of the heating plate, and the position of the heating plate may be fixed using a magnetic attraction of a magnetic member.

According to an embodiment of the present disclosure, there may be provided a facility for processing substrates including: an index module where a substrate is carried in and out; and a treating module configured to include an apparatus for processing substrates that performs a thermal process on the substrate. The apparatus for processing substrates may include: a housing configured to provide an internal space; a heating plate provided in the internal space and configured to heat a substrate; a cooling unit provided on a side of the heating unit and configured to cool the substrate; and a transport plate configured to transport the substrate between the heating unit and the cooling unit, wherein the heating unit may include: a heating plate provided in a heating space to heat a substrate while supporting the substrate; and a fixing portion configured to fix a position of the heating plate. The fixing portion may include a plurality of fixing members spaced at regular intervals along a circumference of the heating plate, and the position of the heating plate may be fixed using a magnetic attraction of a magnetic member.

According to embodiments of the present disclosure, by fixing the position of a heating plate using a magnetic member and a position fixing pin movably provided on the magnetic member in the expansion direction of the heating plate, it is possible to keep the heating plate flat without changing the position thereof even when the heating plate is thermally deformed.

Furthermore, according to the embodiments of the present disclosure, since the cause of sealing failure is eliminated as the heating plate remains level, substrate defects and device defects caused by sealing failure can be prevented.

The effects of the present disclosure are not limited to the above effects, and effects not mentioned will be clearly understood by those skilled in the art from this specification and the accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings.

The embodiments of the present disclosure may be modified in various forms, and the scope of the present disclosure should not be construed as being limited due to the examples described below. These embodiments are provided to more completely explain the present disclosure to those skilled in the art. Therefore, the shapes of components in the drawings are exaggerated to emphasize a clearer explanation.

Hereinafter, an embodiment of the present disclosure will be described in detail with reference to FIGS. 1 to 7. In the following embodiment, as an example of an apparatus for processing substrates, a device for applying photoresist on a substrate and developing the substrate after exposure will be described. However, the present disclosure is not limited thereto, and may be applied to various types of devices including a thermal chamber for heat treating a substrate. For example, the apparatus for processing substrates may be a device that performs a process of removing foreign substances on a substrate by supplying a cleaning solution to the substrate, or a process of removing a thin film from the substrate by supplying a chemical solution to the substrate.

Figure 1:
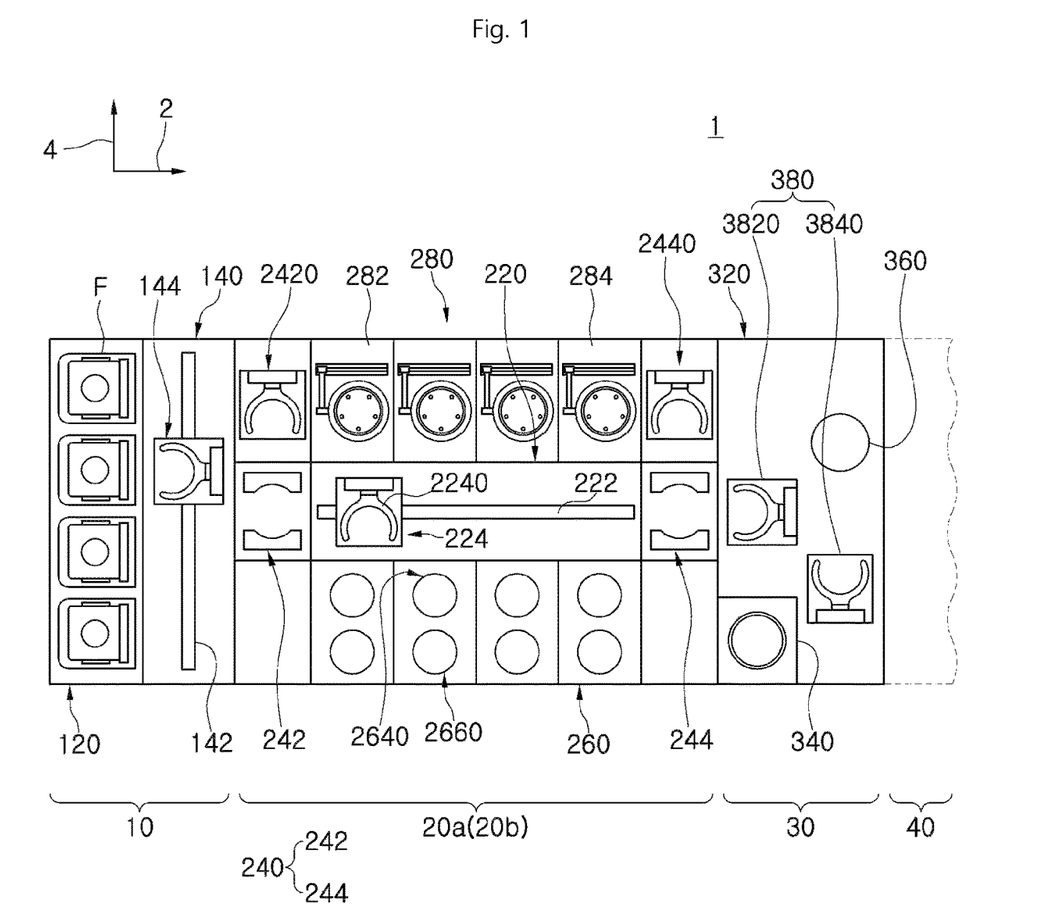
FIG. 1 is a plan view schematically showing a facility for processing substrates according to an embodiment of the present disclosure.

FIG. 1 is a plan view schematically showing a facility for processing substrates according to an embodiment of the present disclosure.

Referring to FIG. 1, the facility for processing substrates 1 includes an index module 10, a treating module, and an interface module 30. According to the embodiment, the index module 10, the treating module, and the interface module 30 are sequentially arranged in a line. Hereinafter, the direction in which the index module 10, the treating module, and the interface module 30 are arranged is defined as a first direction 2, the direction perpendicular to the first direction 2 is defined as a second direction 4 when viewed from above, and the direction perpendicular to the plane including both the first direction 2 and the second direction 4 is defined as a third direction 6.

The index module 10 transports a substrate W from a container F in which the substrate W is stored to the treating module that treats the substrate W. The index module 10 stores the substrate W, which has been treated in the treating module, into the container F. The longitudinal direction of the index module 10 is provided as the second direction 4. The index module 10 has a load port 120 and an index frame 140.

The container F containing the substrate W is seated in the load port 120. The load port 120 is located on the opposite side of the treating module with respect to the index frame 140. A plurality of load ports 120 may be provided, and the plurality of load ports 120 may be arranged in a line along the second direction 4. The number of load ports 120 may increase or decrease depending on process efficiency and footprint conditions of the treating module.

A plurality of slots (not shown) are formed in the container F to accommodate the substrates W in a state in which they are arranged horizontally with respect to the ground. As the container F, an airtight container such as a front opening unified pod (FOUP) may be used. The container F may be placed in the load port 120 by a transport means (not shown) such as an overhead transfer, overhead conveyor, or automatic guided vehicle or by an operator.

An index rail 142 and an index robot 144 are provided inside the index frame 140. The index rail 142 is provided in the index frame 140 with its longitudinal direction along the second direction 4. The index robot 144 may transport the substrate W. The index robot 144 may transport the substrate W between the index module 10 and a buffer chamber 240 to be described later. The index robot 144 may include an index hand 1440. The substrate W may be placed on the index hand. The configuration of the index hand may be the same as or similar to that of a transport hand 2240 to be described later. The index hand may be provided to be movable along the second direction 4 on the index rail 142. Accordingly, the index hand may move forward and backward along the index rail 142. In addition, the index hand may be provided to be rotatable about an axis parallel to the third direction 6 and movable along the third direction 6.

The treating module receives the substrate W stored in the container F and performs a coating process and a developing process on the substrate W. The treating module has a coating block 20a and a developing block 20b. The coating block 20a performs a coating process on the substrate W. The developing block 20b performs a developing process on the substrate W. A plurality of coating blocks 20a are provided, and the coating blocks 20a are provided stacked on top of each other. A plurality of developing blocks 20b are provided, and the developing blocks 20b are provided stacked on top of each other.

The coating blocks 20a may be disposed below the developing blocks 20b. As an example, the plurality of coating blocks 20a may perform the same process and be provided with the same structure. In addition, the plurality of developing blocks 20b may perform the same process and be provided with the same structure.

The coating block 20a has a transport chamber 220, a buffer chamber 240, a thermal chamber 260, and a liquid treating chamber 280. The transport chamber 220 provides a space for transporting the substrates W between the buffer chamber 240 and the thermal chamber 260, between the buffer chamber 240 and the liquid treating chamber 280, and between the thermal chamber 260 and the liquid treating chamber 280. The buffer chamber 240 provides a space in which the substrates W carried into the coating block 20a and the substrates W exported from the coating block 20a temporarily stay. The thermal chamber 260 performs a thermal process on the substrates W. The thermal process may include a cooling process and a heating process. The liquid treating chamber 280 supplies liquid to the substrate W to form a liquid film. The liquid film may be a photoresist film or an anti-reflection film.

The longitudinal direction of the transport chamber 220 may be in the first direction 2. A guide rail 222 and a transport robot 224 are provided in the transport chamber 220. The guide rail 222 is provided in the transport chamber 220 with the longitudinal direction thereof is in the first direction 2. The transport robot 224 may be provided to be linearly movable along the first direction 2 on the guide rail 222. The transport robot 224 transports the substrates W between the buffer chamber 240 and the thermal chamber 260, between the buffer chamber 240 and the liquid treating chamber 280, and between the thermal chamber 260 and the liquid treating chamber 280.

As an example, the transport robot 224 has the transport hand 2240 on which the substrate W is placed. The transport hand 2240 may be provided to be capable of forward and backward movement, rotational movement based on an axis parallel to the third direction 6, and movement along the third direction 6.

A plurality of buffer chambers 240 are provided. Some of the buffer chambers 240 are disposed between the index module 10 and the transport chamber 220. Hereinafter, these buffer chambers are defined as a front buffer 242. The front buffer 242 is provided in plurality, and may be positioned to be stacked with each other along the vertical direction. Some of the buffer chambers 240 are disposed between the transport chamber 220 and the interface module 30. Hereinafter, these buffer chambers are defined as a rear buffer 244. The rear buffer 244 is provided in plurality, and may be stacked on top of each other in the vertical direction. Each of the front buffers 242 and the rear buffers 244 temporarily stores the substrates W. The substrates W stored in the front buffer 242 are carried in or out by the index robot 144 and the transport robot 224. The substrates W stored in the rear buffer 244 are carried in or out by the transport robot 224 and a first robot 3820 to be described later.

Buffer robots 2420 and 2440 may be provided on one side of the buffer chamber 240. The buffer robots 2420 and 2440 may include a front buffer robot 2420 and a rear buffer robot 2440. The front buffer robot 2420 may be provided on one side of the front buffer 242. The rear buffer robot 2440 may be provided on one side of the rear buffer 244. However, it is not limited thereto, and the buffer robots 2420 and 2440 may be provided on both sides of the buffer chamber 240.

The front buffer robot 2420 may transport the substrates W between the front buffers 242.

The front buffer robot 2420 may include a front buffer hand. The front buffer hand may be moved in a vertical direction along the third direction 6. The front buffer hand may be rotated. The front buffer hand may transport the substrate W.

The rear buffer robot 2440 may transport the substrates W between the rear buffers 244. The rear buffer robot 2440 may include a rear buffer hand. The configuration of the rear buffer hand is the same as or similar to that of the front buffer hand. Therefore, the description of the rear buffer hand is omitted.

The liquid treating chamber 280 is provided in plurality. Some of the liquid treating chambers 280 may be provided to be stacked on top of each other. The liquid treating chambers 280 are disposed on one side of the transport chamber 220. The liquid treating chambers 280 are arranged side by side along the first direction 2. Some of the liquid treating chambers 280 are provided adjacent to the index module 10. Hereinafter, these liquid treating chambers 280 are defined as a front liquid treating chamber 282. Some other liquid treating chambers 280 are provided adjacent to the interface module 30. These liquid treating chambers 280 are defined as a rear liquid treating chamber 284.

The front liquid treating chamber 282 applies the first liquid on the substrate W, and the rear liquid treating chamber 284 applies the second liquid on the substrate W. The first liquid and the second liquid may be different types of liquids. According to an example, the first liquid is an anti-reflection film, and the second liquid is a photoresist. The photoresist may be applied on the substrate W to which the anti-reflection film is applied.

Alternatively, the first liquid may be a photoresist and the second liquid may be an anti-reflection film. In this case, the anti-reflection film may be applied on the substrate W to which the photoresist is applied. Alternatively, the first liquid and the second liquid are the same type of liquid, and both may be photoresists.

The developing block 20b has a transport chamber 220, a buffer chamber 240, a thermal chamber 260, and a liquid treating chamber 280. Since the transport chamber 220, the buffer chamber 240, the thermal chamber 260, and the liquid treating chamber 280 of the developing blocks 20b are provided in substantially similar structures and arrangements to the transport chamber 220, the buffer chamber 240, the thermal chamber 260, and the liquid treating chamber 280 of the coating block 20a, a description thereof will be omitted. However, all of the liquid treating chambers 280 of the developing block 20b perform a developing process of developing the substrate W by supplying a developing solution in the same way.

The interface module 30 connects the treating module and an external exposure device 40.

The interface module 30 includes an interface frame 320, an additional process chamber 340, an interface buffer 360, and a transport member 380.

The interface frame 320 provides an internal space. A fan filter unit may be provided at the upper end of the interface frame 320 to form a descending airflow in the internal space. The additional process chamber 340, the interface buffer 360, and the transport member 380 are provided in the internal space of the interface frame 320.

The additional process chamber 340 may perform a predetermined additional process before the substrate W, on which the process is completed in the coating block 20a, is carried into the exposure device 40. Alternatively, the additional process chamber 340 may perform a predetermined additional process before the substrate W, on which the process is completed in the exposure device 40, is carried into the developing blocks 20b. According to an example, the additional process may be an edge exposure process of exposing the edge area of the substrate W, an upper surface cleaning process of cleaning the upper surface of the substrate W, or a lower surface cleaning process of cleaning the lower surface of the substrate W. The additional process chamber 340 may be provided in plurality, and the plurality of additional process chambers 340 may be provided to be stacked on top of each other.

The additional process chambers 340 may all be provided to perform the same process. Alternatively, some of the additional process chambers 340 may be provided to perform different processes.

The interface buffer 360 provides a space where the substrates W transported between the additional process chamber 340, the exposure device, and the developing block 20b temporarily stays during transport. The interface buffer 360 may be provided in plurality, and the plurality of interface buffers 360 may be provided to be stacked on top of each other. According to an example, based on the extension line of the transport chamber 220 in the longitudinal direction, the additional process chamber 340 may be disposed on one side while the interface buffer 360 may be disposed on the other side.

The transport member 380 transports the substrates W between the coating block 20a, the additional process chamber 340, the exposure device 40, and the developing block 20b. The transport member 380 may be provided by one or a plurality of robots. According to an example, the transport member 380 includes a first robot 3820, a second robot 3840, and a third robot (not shown). The first robot 3820 transports the substrates W between the coating block 20a, the additional process chamber 340, and the interface buffer 360. The second robot 3840 transports the substrates W between the interface buffer 360 and the exposure device 40. The third robot (not shown) transports the substrates W between the interface buffer 360 and the developing block 20b.

The first robot 3820, the second robot 3840, and the third robot (not shown) each include a hand on which the substrate W is placed. The hand may be provided for forward and backward movement, rotation about an axis parallel to the third direction 6, and movement along the third direction 6. The hands of the first robot 3820, the second robot 3840, and the third robot (not shown) may all be provided in the same or similar shape as the transport hand 2240 of the transport robot 224. Alternatively, the hands of the robots that directly transports the substrates W to a cooling plate 2642 of the thermal chamber may be provided in the same or similar shape as the transport hand 2240 of the transport robot 224, while the hands of the rest of the robots may be provided in a different shape.

Figure 2:
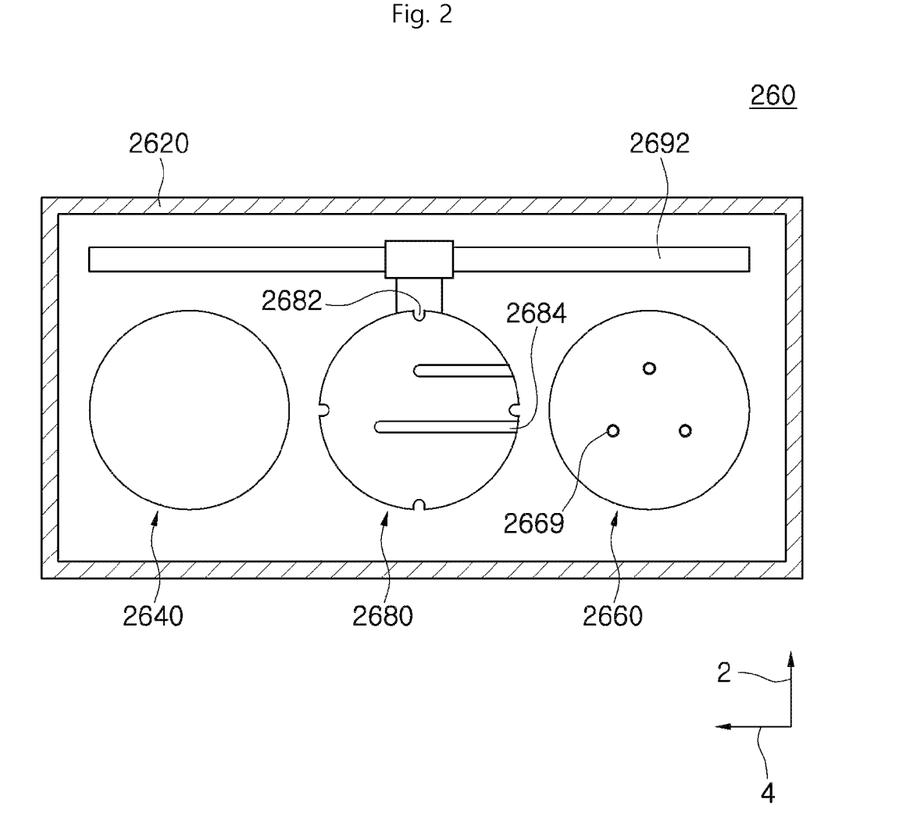
FIG. 2 is a plan view schematically showing an example of a thermal chamber shown in FIG. 1.
Figure 3:
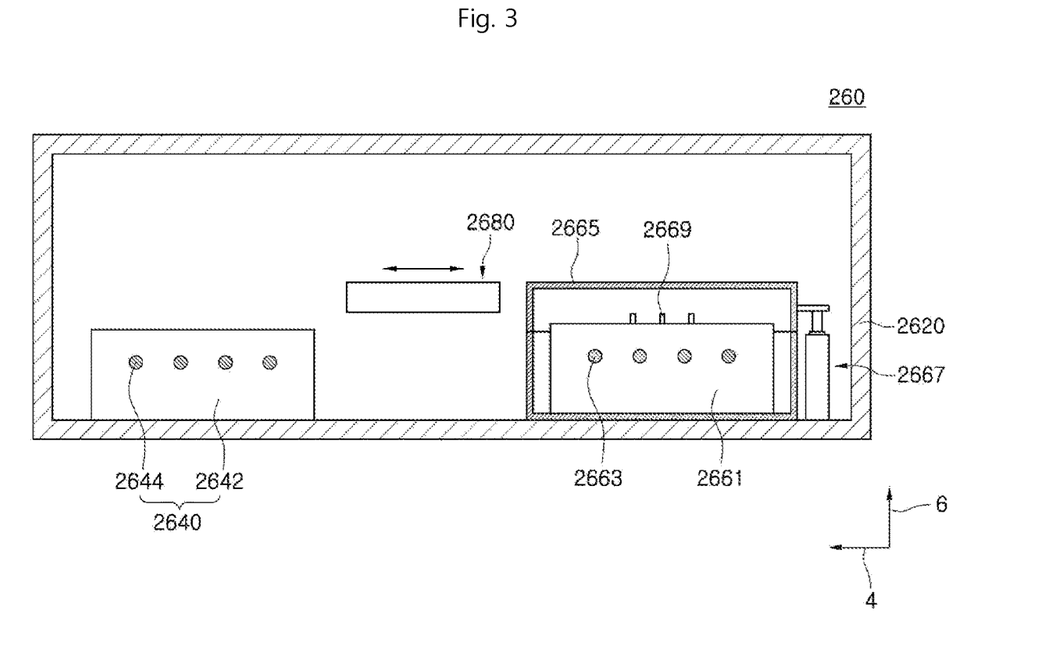
FIG. 3 is a front view of FIG. 2.

FIG. 2 is a plan view schematically showing an example of a thermal chamber shown in FIG. 1, and FIG. 3 is a front view of FIG. 2. Referring to FIGS. 2 and 3, the thermal chamber 260 may be provided in plurality. The thermal chambers 260 are disposed along the first direction 2. The thermal chambers 260 are located on one side of the transport chamber 220. The thermal chamber 260 may include a substrate processing apparatus for thermally processing a substrate. The substrate processing apparatus included in the heat treatment chamber may include a housing 2620, a cooling unit 2640, a heating unit 2660, and a transport plate 2680.

The housing 2620 is generally provided in a cuboid shape. The housing 2620 provides an internal space. An entrance (not shown) through which the substrate W is in and out is formed on the sidewall of the housing 2620. The entrance may remain open. A door (not shown) may be provided to selectively open and close the entrance.

The cooling unit 2640, the heating unit 2660, and the transport plate 2680 may be provided in the internal space of the housing 2620. The cooling unit 2640 and the heating unit 2660 are provided side by side along the second direction 4. According to an example, the cooling unit 2640 may be located relatively closer to the transport chamber 220 than the heating unit 2660. The cooling unit 2640 includes a cooling plate 2642. The cooling plate 2642 may have a generally circular shape when viewed from the top. A cooling member 2644 is provided on the cooling plate 2642. As an example, the cooling member 2644 is provided inside the cooling plate 2642 and may be provided as a passage through which cooling fluid flows.

The heating units 2660 provided in some of the thermal chambers 260 may improve the substrate W adhesion rate of the photoresist by supplying gas during heating the substrate W. According to an example, the gas supplied during heating the substrate W may be hexamethyldisilane.

The heating unit 2660 may include a heating plate 2661, a heater 2663, a cover 2665, and a driver 2667. The heating unit 2660 may have a generally circular shape when viewed from the top. The heating plate 2661 may have a diameter larger than the substrate W. The heater 2663 is installed on the heating plate 2661. The heater 2663 may be provided as an exothermic resistive to which an electric current is applied.

The heating plate 2661 is provided with lift pins 2669 that can be driven up and down along the third direction 6. The lift pins 2669 receive a substrate W from a transport means outside the heating unit 2660 and place the substrate W on the heating plate 2661, or lift the substrate W from the heating plate 2661 and deliver the substrate W to the transport means outside the heating unit 2660. As an example, three lift pins 2669 may be provided.

The cover 2665 has an open space in the lower part thereof. The cover 2665 is located above the heating plate 2661 and is moved up and down by the driver 2667. The space formed by the cover 2665 and the heating plate 2661 as the cover 2665 moves is provided as a heating space for heating the substrate W.

The transport plate 2680 is generally provided in the shape of a disc and has a diameter corresponding to the substrate W. A notch 2682 may be formed at the edge of the transport plate 2680. When the up and down positions of the transport hand 2240 and the transport plate 2680 change from the position where the transport hand 2240 and the transport plate 2680 are aligned in the up and down directions, transfer of the substrate W is made between the transport hand 2240 and the transport plate 2680. The transport plate 2680 is mounted on a guide rail 2692 and may be moved between one region and another region along the guide rail 2692 by the driver.

The transport plate 2680 is provided with a plurality of slit-shaped guide grooves 2684.

The longitudinal direction of the guide groove 2684 is provided along the second direction 4, and the guide grooves 2684 are located spaced apart from each other along the first direction 2. The guide grooves 2684 prevent the transport plate 2680 and the lift pins 2669 from interfering with each other when transfer of the substrate W is made between the transport plate 2680 and the heating unit 2660.

Cooling of the substrate W is made in a state in which the transport plate 2680 on which the substrate W is placed is in contact with the cooling plate 2642. In order to ensure good heat transfer between the cooling plate 2642 and the substrate W, the transport plate 2680 is provided in a material with high thermal conductivity.

As an example, the transport plate 2680 may be provided in a metal material.

Alternatively, the transport plate 2680 may be provided in combination with the cooling unit 2640.

Figure 4:
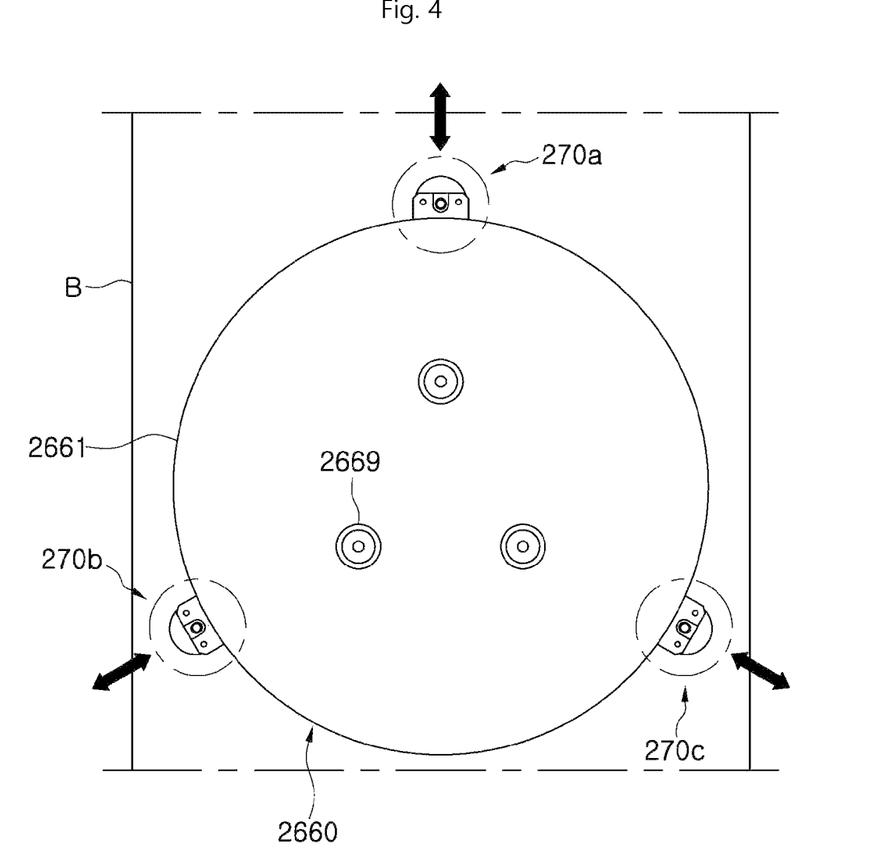
FIG. 4 is a partial enlarged view showing a heating unit shown in FIG. 2.
Figure 5:
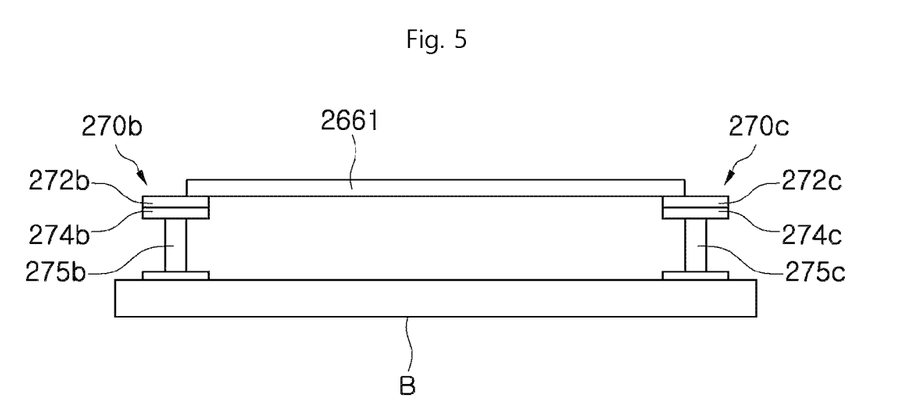
FIG. 5 is a front view of FIG. 4.
Figure 6:
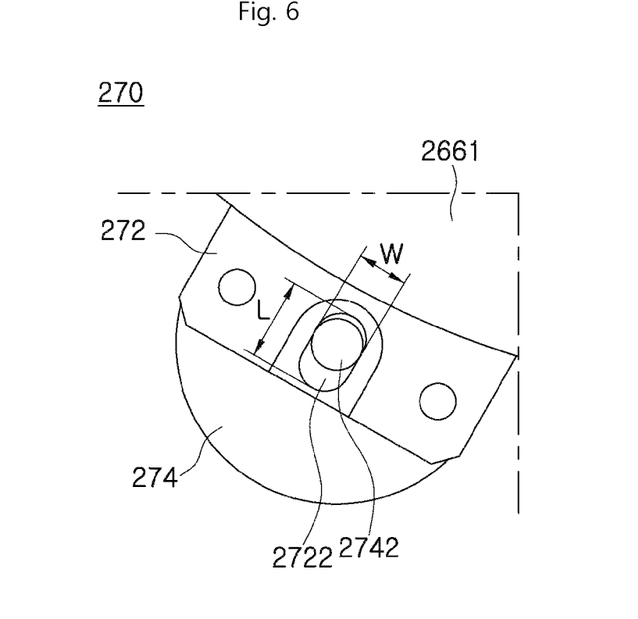
FIG. 6 is a partial enlarged view showing a fixing member shown in FIG. 4.
Figure 7:
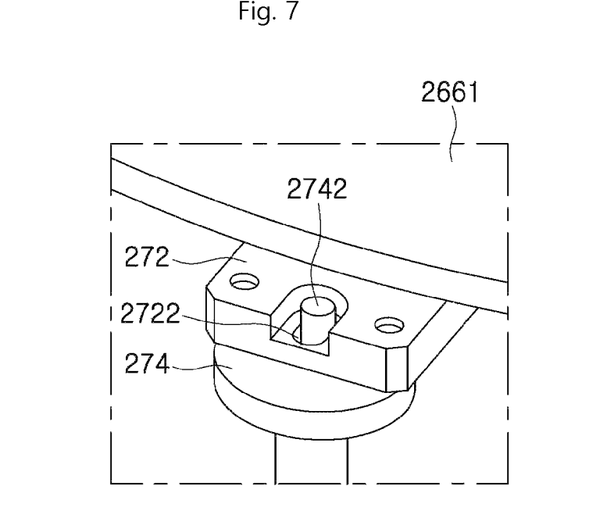
FIG. 7 is a perspective view of FIG. 5.

Hereinafter, referring to FIGS. 4 to 7, the heating unit 2660 will be described in more detail. FIG. 4 is a partial enlarged view showing a heating unit shown in FIG. 2, FIG. 5 is a front view of FIG. 4, FIG. 6 is a partial enlarged view showing a fixing member shown in FIG. 4, and FIG. 7 is a perspective view of FIG. 5.

The heating unit 2660 further includes a fixing portion for fixing the position of the heating plate 2661. The fixing portion includes a plurality of fixing members 270 spaced at regular intervals along the circumference of the heating plate 2661. It is preferable that the plurality of fixing members 270 are arranged so that the spacing therebetween is the same. As an example, three fixing members 270 may be provided (270*a*, 270*b*, and 270*c*). The fixing portion fixes the position of the heating plate 2661 on a base plate B corresponding to the lower part of the heating space.

The fixing members 270 may fix the position of the heating plate 2661 using the magnetic attraction of the magnetic member. The fixing member 270 may include: an upper magnetic member 272 coupled with the heating plate 2661; a lower magnetic member 274 provided under the upper magnetic member 272; and a support member 275 supporting the lower magnetic member 274. The lower magnetic member 274 is completely fixed in the heating space by means of the support member 275.

The upper magnetic member 272 and the lower magnetic member 274 form an attraction by having different polarities. Although the position of the heating plate 2661 is fixed by the attraction between the upper magnetic member 272 and the lower magnetic member 274, it is not completely fixed. For example, when a force greater than the attraction between the upper magnetic member 272 and the lower magnetic member 274 is applied to the upper magnetic member 272, the position of the upper magnetic member 272 may be shifted.

The upper magnetic member 272 includes a slot 2722 and the lower magnetic member 274 includes a position fixing pin 2742 in order to prevent the upper magnetic member 272 from being completely spaced from the lower magnetic member 274 and to fix the center position of the heating plate 2661.

The slot 2722 is a hole penetrating the upper magnetic member 272 from top to bottom and having a length L and a width W, and is formed to have the length L in the direction in which the circumference of the heating plate 2661 is extended. The length L of the slot 2722 is greater than the width W.

As an example, the slot 2722 may be provided in the form of an ellipse having two centers. However, it is not limited thereto, and if necessary, the slot 2722 may be provided in another form in which the width W is lesser the length L.

The length of the slot 2722 should be determined in consideration of the thermal expansion rate of the heating plate 2661. Preferably, the length of the slot 2722 should be determined so that the upper magnetic member 272 may move more than the length from the position before the heating plate expansion in consideration of the maximum amount at which the heating plate 2661 expands in the thermal temperature range.

The position fixing pin 2742 is fixed on the upper surface of the lower magnetic member 274 and installed at a position corresponding to the slot 2722. The position fixing pin 2742 is provided in a shape that fully engages to the width of slot 2722. That is, the diameter or width of the position fixing pin 2742 is equal to the width of the slot 2722. By installing the position fixing pin 2742, which is provided in a shape that fully meshes to the width of the slot 2722, at a position corresponding to the slot 2722, the position fixing pin 2742 is inserted into the slot 2722 when the upper magnetic member 272 and the lower magnetic member 274 are fully engaged.

In addition, since the position fixing pin 2742 has a width equal to the width W of the slot 2722, and the length L of the slot 2722 is greater than the width W of the slot 2722, the upper magnetic member 272 may be moved in the longitudinal direction L on the lower magnetic member 274 whose position is fixed. That is, the upper magnetic member 272 may slide in the longitudinal direction L on the lower magnetic member 274.

As an example, the cross-sectional area of the position fixing pin 2742 may be a circle. However, it is not limited thereto, and depending on the shape of the slot 2722, the shape of the cross-sectional area of the position fixing pin 2742 may be provided in various forms in which the width length of the cross-sectional area is equal to the width length of the slot 2722. The cross-sectional length of the position fixing pin 2742, however, should be shorter than the length of the slot. This is because the cross-sectional length of the position fixing pin 2742 needs to be shorter than the length of the slot 2722 so that the upper magnetic member 272 may slide on the lower magnetic member 274. That is, the cross-sectional length of the position fixing pin 2742 needs to be shorter than the length of the slot 2722 in order to respond to the thermal deformation of the heating plate 2661, and even if thermal defamation occurs in the heating plate 2661, the heating plate 2661 may remain flat without bending.

The cross-sectional length of the position fixing pin 2742 should be determined in consideration of the thermal expansion rate of the heating plate 2661. Preferably, the cross-sectional length of the position fixing pin 2742 should be determined so that the upper magnetic member 272 may move more than the length from the position before the heating plate expansion in consideration of the maximum amount at which the heating plate 2661 expands in the thermal temperature range.

Due to this configuration, even if thermal expansion of the heating plate 2661 occurs in the process of heating the heating plate 2661 to the target temperature in order to heat the substrate to the target temperature, the upper magnetic member 272 may slide in the expansion direction from the lower magnetic member 274 so that the flatness of the heating plate 2661 may be maintained. In addition, since the upper magnetic member 272 may be moved only in the longitudinal direction L by means of the position fixing pin 2742 having a width equal to the width of the slot 2722, the center position of the heating plate 2661 may remain the same as before expansion.

In other words, even if the heating plate 2661 is thermally expanded during the heating process, only the size of the heating plate 2661 is expanded by the upper magnetic member 272 moving along the longitudinal direction of slot 2722 while the center position of the heating plate 2661 remains the same, the heating plate 2661 may remain level without changing position.

Thus, sealing failure does not occur since the heating plate 2661 remains level regardless of the thermal deformation, and substrate defects and device defects caused by sealing failure may be prevented.

Meanwhile, the position fixing pin 2742 may be provided in one piece with the lower magnetic member 274. That is, the position fixing pin 2742 may be a protrusion protruding upwards from the upper surface of the lower magnetic member 274. As described above, the protrusion 2742 may be formed in such a way that the width of the cross-sectional area thereof is equal to the width of the slot 2722 so as to be completely engaged with the width W of the slot 2722. At this time, it is preferable that the length of the cross-sectional area of the protrusion 2742 is lesser than the length L of the slot 2722.

As an example, the upper magnetic member 272 and the lower magnetic member 274 may be provided as permanent magnets.

Alternatively, the upper magnetic member 272 and the lower magnetic member 274 may be provided as electromagnets in which the strength of the magnet is controlled according to the magnitude of the electric current.

Alternatively, one of the upper magnetic member 272 and the lower magnetic member 274 may be provided as a permanent magnet and the other may be provided as an electromagnet.

When at least one of the upper magnetic member 272 and the lower magnetic member 274 is provided as an electromagnet, the electric current applied to the electromagnet may vary depending on the heating process for the heating plate 2661.

For example, the electric current applied to the electromagnet may be a first electric current when the heating plate 2661 is heated to the target temperature, whereas the electric current applied to the electromagnet from the time point when the temperature of the heating plate 2661 reaches the target temperature may be a second electric current. At this time, the second electric current has a higher current value than the first electric current.

In the process of raising the temperature of the heating plate 2661 to the target temperature, less force is required to move the upper magnetic member 272 by applying a relatively low first electric current to the electromagnet, and thus, response to thermal expansion of the heating plate 2661 may be carried out easily. Accordingly, it is possible to more effectively respond to the thermal expansion occurred during the heating process of the heating plate 2661. For example, the first electric current is preferably low enough that the upper magnetic member 272 does not deviate from the lower magnetic member 274.

On the other hand, when the temperature of the heating plate 2661 reaches the target temperature, the heating process of the heating plate 2661 is interrupted. In this case, it is preferable that the position of the upper magnetic member 272 is completely fixed. By applying the second electric current having a higher current value than the first electric current to the electromagnet, the position of the upper magnetic member 272 may be fixed. It is preferable that the second electric current is high enough to completely block the movement of the upper magnetic member 272.

The support member 275 is fixed to the lower surface of the lower magnetic member 274 and fixed to the upper part of the base plate B. The lower magnetic member 274 may be fixed in its position by the support member 275.

The above detailed description illustrates the present disclosure. In addition, the foregoing describes preferred embodiments of the present disclosure, and the present disclosure may be used in various other combinations, modifications, and environments. That is, the present disclosure may be changed or modified within the scope of the concept of the invention disclosed herein, to the extent equal to the published disclosure and/or to the extent of skill or knowledge in the art. The authored embodiments describe the best state for implementing the technical idea of the present disclosure, and various changes required are possible according to the specific application field and use of the present disclosure. Therefore, the above detailed description of the present disclosure is not intended to limit the present disclosure to the disclosed state of implementation. In addition, the attached claims should be construed to include other states of implementation.

What is claimed is:

1. A heating unit, comprising:
   a heating plate provided in a heating space to heat a substrate while supporting the substrate; and
   a fixing member including a magnetic member and configured to fix a position of the heating plate using a magnetic force of the magnetic member,
   wherein the fixing member comprises a plurality of fixing members spaced apart from each other at a regular interval along a circumference of the heating plate,
   wherein the fixing member comprises:
   an upper magnetic member coupled to the heating plate; and
   a lower magnetic member fixedly installed under the upper magnetic member,
   wherein the upper magnetic member and the lower magnetic member have different polarities,
   wherein the upper magnetic member comprises a slot having a length in a radial direction while the lower magnetic member comprises a position fixing pin fixedly installed at a position corresponding to the slot on an upper surface of the lower magnetic member, and
   wherein the radial direction is a direction in which the circumference of the heating plate expands.

2. The heating unit of claim 1,
   wherein the length of the slot is formed greater than a width of the slot, and the position fixing pin is engaged with the slot.

3. The heating unit of claim 1,
   wherein the upper magnetic member comprises a slot with length in one direction while the lower magnetic member comprises a protrusion protruding upward from the upper surface of the lower magnetic member, and
   wherein the protrusion is formed at a position corresponding to the slot, and the one direction is a direction in which the circumference of the heating plate expands.

4. The heating unit of claim 3,
   wherein the length of the slot is formed greater than a width of the slot, and a cross-sectional width of the protrusion is equal to the width of the slot, and a cross-sectional length of the protrusion is shorter than the length of the slot.

5. The heating unit of claim 1,
   wherein the upper magnetic member and the lower magnetic member are permanent magnets or electromagnets.

6. The heating unit of claim 5,
   wherein when at least one of the upper magnetic member and the lower magnetic member is an electromagnet, an electric current applied to the electromagnet is controlled on the basis of a heating process of the heating plate.

7. The heating unit of claim 6,
   wherein a first electric current is applied to the electromagnet when the heating plate is heated to a target temperature, while a second electric current higher than the first electric current is applied to the electromagnet from a time point when a temperature of the heating plate reaches the target temperature.

8. An apparatus for processing substrates, comprising:
   a housing configured to provide an internal space;
   a heating unit provided in the internal space and configured to heat a substrate;
   a cooling unit provided on a side of the heating unit and configured to cool the substrate; and
   a transport plate configured to transport the substrate between the heating unit and the cooling unit,
   wherein the heating unit comprises:
   a heating plate provided in a heating space to heat the substrate while supporting the substrate; and a fixing member including a magnetic member and configured to fix a position of the heating plate using a magnetic force of the magnetic member, wherein the fixing member comprises a plurality of fixing members spaced apart from at a regular interval along a circumference of the heating plate, wherein the fixing member comprises:

an upper magnetic member coupled to the heating plate; and a lower magnetic member fixedly installed under the upper magnetic member, wherein the upper magnetic member and the lower magnetic member have different polarities, wherein the upper magnetic member comprises a slot having a length in a direction in which the circumference of the heating plate expands while the lower magnetic member comprises a position fixing pin fixedly installed at a position corresponding to the slot on an upper surface of the lower magnetic member, and wherein the length of the slot is formed greater than a width of the slot, and the position fixing pin is provided in a shape that a cross-sectional width thereof is equal to the width of the slot while a cross-sectional length thereof is shorter than the length of the slot.

9. The apparatus for processing substrates of claim 8, wherein the upper magnetic member comprises a slot having a length in a direction in which the circumference of the heating plate expands while the lower magnetic member comprises a protrusion configured to protrude upward from the upper surface of the lower magnetic member at a position corresponding to the slot on the upper surface of the lower magnetic member, and wherein the length of the slot is formed greater than a width of the slot, and the protrusion is provided in a shape that a cross-sectional width thereof is equal to the width of the slot while a cross-sectional length thereof is shorter than the length of the slot.

10. The apparatus for processing substrates of claim 8, wherein the upper magnetic member and the lower magnetic member are permanent magnets or electromagnets.

11. The apparatus for processing substrates of claim 10, wherein when at least one of the upper magnetic member and the lower magnetic member is an electromagnet, a first electric current is applied to the electromagnet when the heating plate is heated to a target temperature, while a second electric current higher than the first electric current is applied to the electromagnet from a time point when a temperature of the heating plate reaches the target temperature.

12. A facility for processing substrates, comprising:

an index module where a substrate is carried in and out; and a treating module configured to include an apparatus for processing substrates that performs a thermal process on the substrate, wherein the apparatus for processing substrates comprises:

a housing configured to provide an internal space;

a heating unit provided in the internal space and configured to heat the substrate;

a cooling unit provided on a side of the heating unit and configured to cool the substrate; and a transport plate configured to transport the substrate between the heating unit and the cooling unit, wherein the heating unit comprises:

a heating plate provided in a heating space to heat the substrate while supporting the substrate; and a fixing member including a magnetic member and configured to fix a position of the heating plate using a magnetic force of the magnetic member, wherein the fixing member comprises a plurality of fixing members spaced apart from each other at a regular interval along a circumference of the heating plate, wherein the fixing members comprise:

an upper magnetic member coupled to the heating plate; and a lower magnetic member fixedly installed under the upper magnetic member, wherein the upper magnetic member and the lower magnetic member have different polarities, wherein the upper magnetic member comprises a slot having a length in a direction in which the circumference of the heating plate expands while the lower magnetic member comprises a position fixing pin provided at a position corresponding to the slot on an upper surface of the lower magnetic member, and wherein the length of the slot is formed greater than a width of the slot, and the position fixing pin is provided in a shape that a cross-sectional width thereof is equal to the width of the slot while a cross-sectional length thereof is shorter than the length of the slot.

13. The facility for processing substrates of claim 12, wherein the upper magnetic member comprises a slot having a length in a direction in which the circumference of the heating plate expands while the lower magnetic member comprises a protrusion formed at a position corresponding to the slot on the upper surface of the lower magnetic member, and wherein the length of the slot is formed greater than a width of the slot, and the protrusion is provided in a shape that a cross-sectional width thereof is equal to the width of the slot while a cross-sectional length thereof is shorter than the length of the slot.

14. The facility for processing substrates of claim 12, wherein the upper magnetic member and the lower magnetic member are permanent magnets or electromagnets, and wherein when at least one of the upper magnetic member and the lower magnetic member is an electromagnet, a first electric current is applied to the electromagnet when the heating plate is heated to a target temperature, while a second electric current higher than the first electric current is applied to the electromagnet from a time point when a temperature of the heating plate reaches the target temperature.

\* \* \* \* \*